(12) United States Patent
Tsironis

(10) Patent No.: US 10,184,972 B1
(45) Date of Patent: Jan. 22, 2019

(54) TRANSISTOR TEST FIXTURE WITH CONVEX SURFACE OF THE SUPPORT BLOCKS

(71) Applicant: Christos Tsironis, Kirkland (CA)

(72) Inventor: Christos Tsironis, Kirkland (CA)

(*) Notice: Subject to any disclaimer, the term of this patent is extended or adjusted under 35 U.S.C. 154(b) by 104 days.

(21) Appl. No.: 15/064,729

(22) Filed: Mar. 9, 2016

Related U.S. Application Data

(60) Provisional application No. 62/130,894, filed on Mar. 10, 2015.

(51) Int. Cl.
*G01R 31/00* (2006.01)
*G01R 31/26* (2014.01)

(52) U.S. Cl.
CPC ..... *G01R 31/2608* (2013.01); *G01R 31/2601* (2013.01)

(58) Field of Classification Search
CPC ............ G01R 31/2886; G01R 31/2862; G01R 31/2891; G01R 35/005; G01R 1/06766; G01R 31/286; G01R 31/2865; G01R 1/04; G01R 1/0408; G01R 1/0416; G01R 1/045; G01R 31/002; G01R 31/2808; G01R 31/2855; G01R 35/00; G01R 31/2806; G01R 31/2822; G01R 31/2831; G01R 31/2851; G01R 31/2868; G01R 31/311; G01R 19/0023; G01R 1/0458; G01R 27/28; G01R 29/26; G01R 31/2884; G01R 35/007; G01R 31/3025; G01R 29/10; G01R 31/265; G01R 1/06744; G01R 1/06772; G01R 17/00; G01R 27/26; G01R 27/32; G01R 29/08; G01R 31/2601; G01R 31/02; G01R 31/2879; G01R 31/3191; G01R 33/34076; G01R 33/365; G01R 33/3678; G01R 33/583; G01R 27/2664; G01R 35/02; G01R 31/28; H01B 11/206; H01J 37/32091; H04B 17/16

See application file for complete search history.

(56) References Cited

U.S. PATENT DOCUMENTS

| | | | | |
|---|---|---|---|---|
| 3,775,644 | A * | 11/1973 | Cotner | G01R 31/2886 269/903 |
| 4,808,919 | A * | 2/1989 | Sylviane | G01R 1/24 324/537 |
| 5,038,100 | A * | 8/1991 | Kushner | G01R 1/045 324/755.09 |
| 5,075,630 | A * | 12/1991 | Babbitt | G01R 1/045 324/629 |
| 5,396,203 | A * | 3/1995 | Hant | G01R 27/2664 324/639 |
| 5,506,513 | A * | 4/1996 | Bacher | G01R 1/045 324/754.14 |

(Continued)

OTHER PUBLICATIONS

Coplanar Waveguide, https://en.wikipedia.org/wiki/Coplanar_waveguide.

(Continued)

*Primary Examiner* — Vinh Nguyen

(57) ABSTRACT

Microwave micro-strip or coplanar waveguide (CPW) transistor test fixtures have the top surface of the input and output blocks forming a convex shape, to allow the soft dielectric substrate to be stretched over the surface and establish secure and continuous ground contact with the block surface and eliminate spurious cavities and discontinuities.

7 Claims, 10 Drawing Sheets

(56) References Cited

U.S. PATENT DOCUMENTS

| | | |
|---|---|---|
| 6,414,563 B1 | 7/2002 | Tsironis |
| 7,265,534 B2 * | 9/2007 | Majerus ................. G01R 27/28 324/756.07 |
| 7,982,477 B2 * | 7/2011 | Ghadaksaz ............ G01R 1/045 324/750.09 |
| 10,001,521 B1 * | 6/2018 | Tsironis ................. G01R 35/00 |
| 2010/0225415 A1 * | 9/2010 | Subedi .................... H01P 5/183 333/111 |
| 2011/0080188 A1 * | 4/2011 | Ghadaksaz ............ G01R 1/045 324/762.01 |

OTHER PUBLICATIONS

"RT/duroid® 5870 /5880 High Frequency Laminates", Rogers Corporation, datasheet.

* cited by examiner

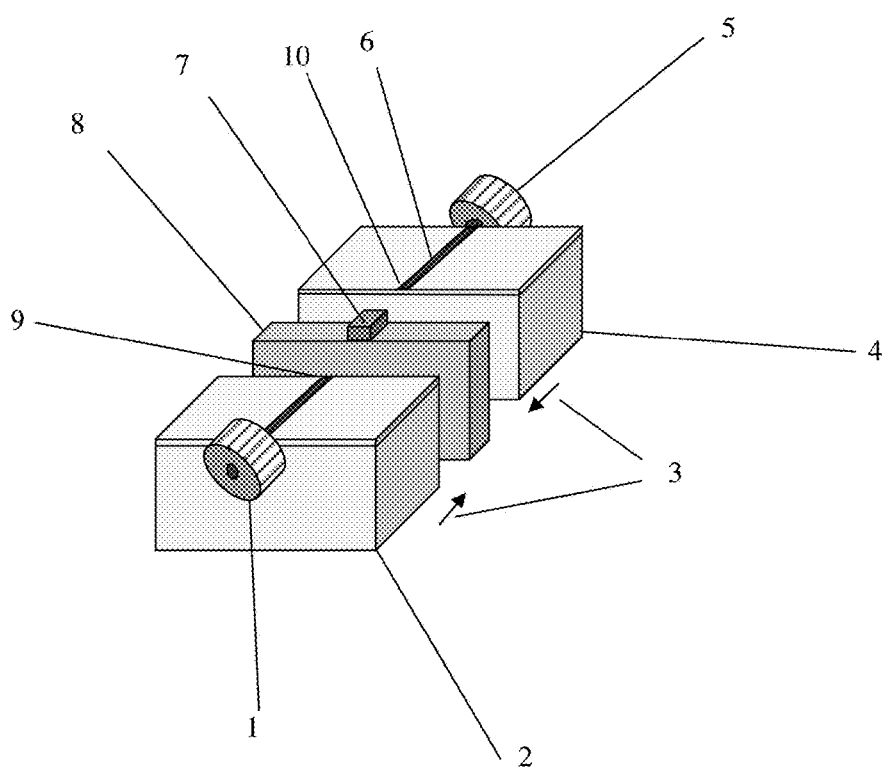
FIG. 1: Prior art

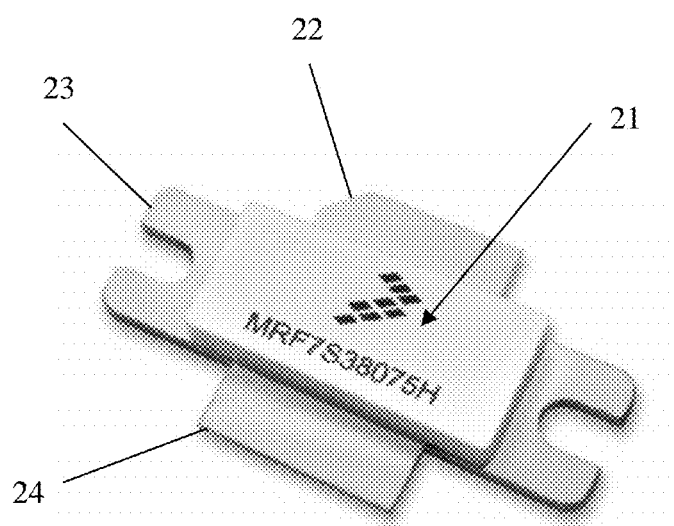
FIG. 2: Prior art

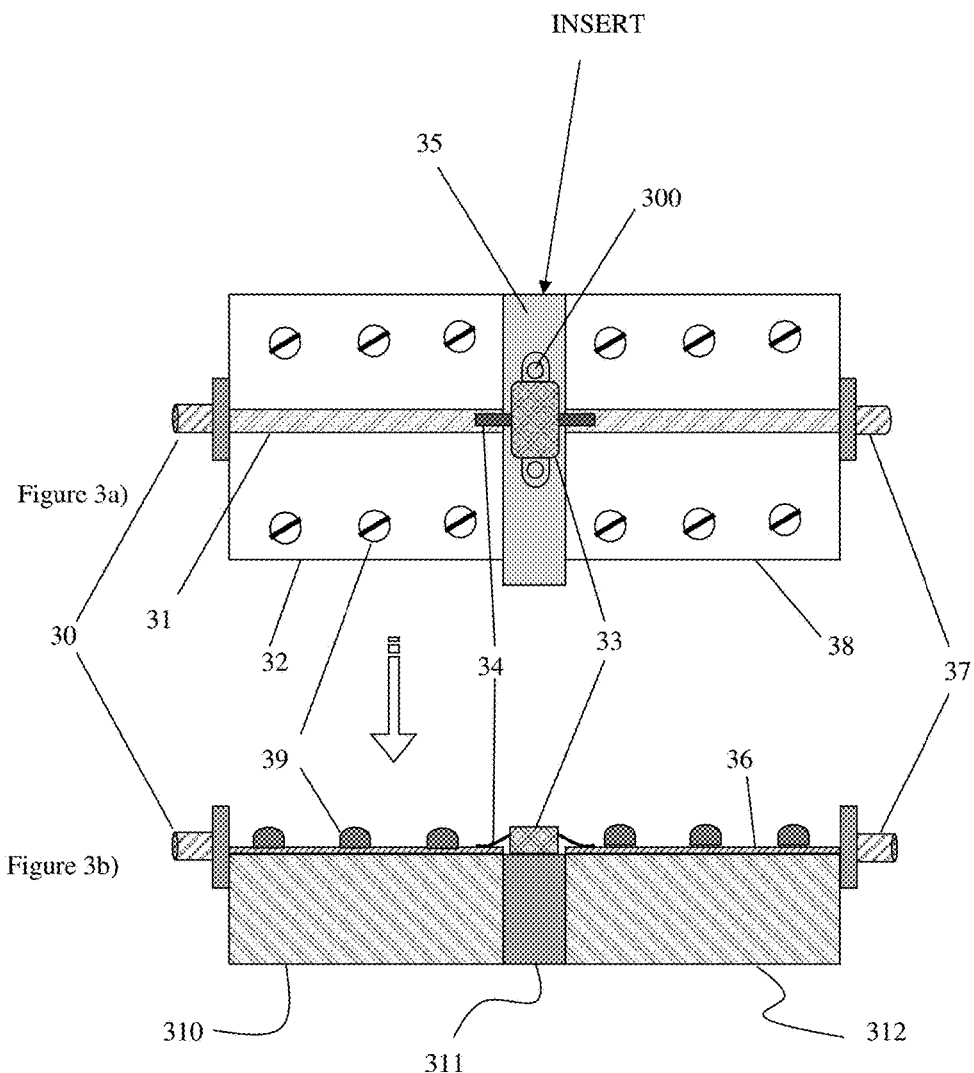
FIG. 3: Prior art

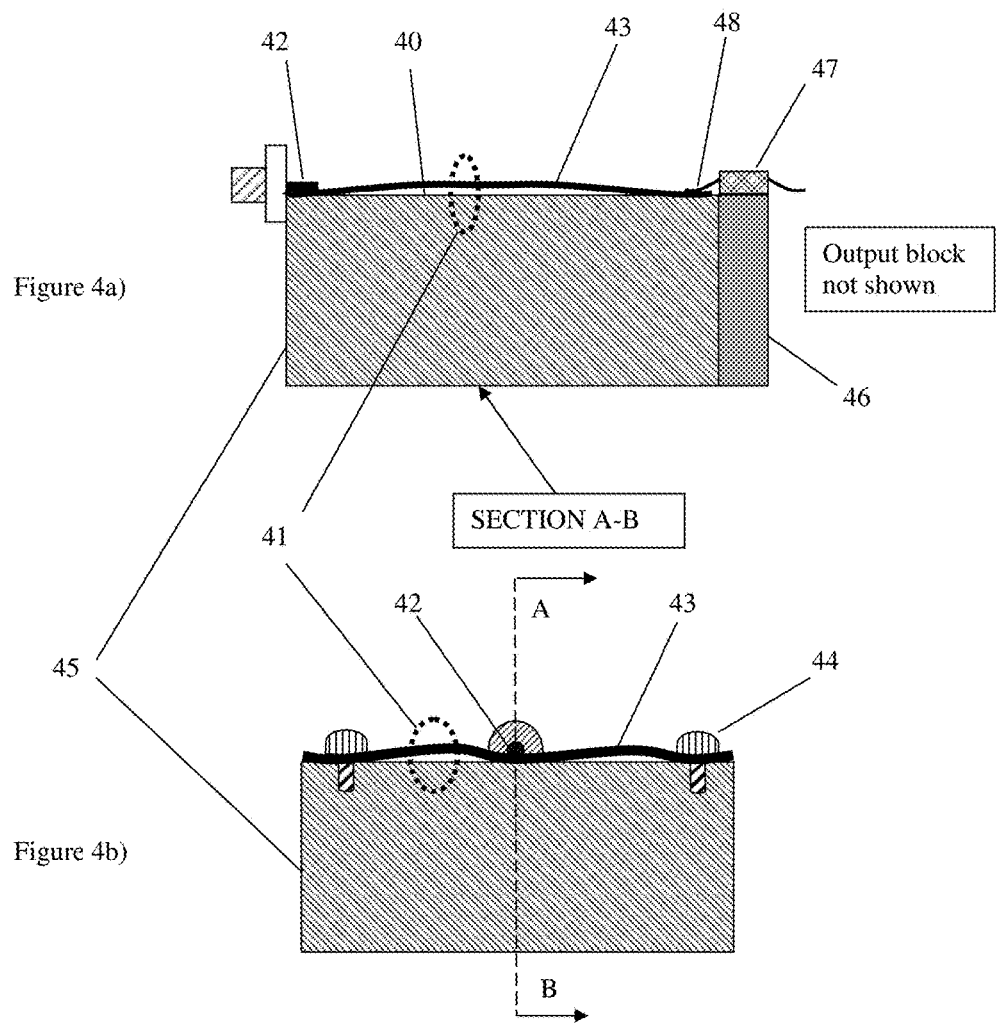
FIG. 4: Prior art

Figure 5a)
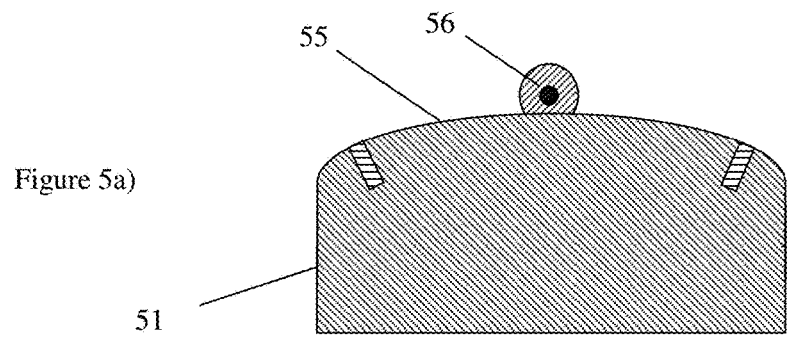
Figure 5b)
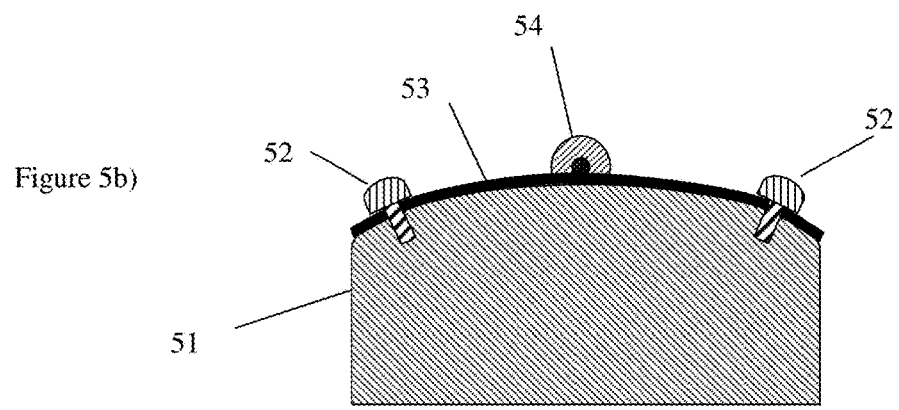
FIG. 5

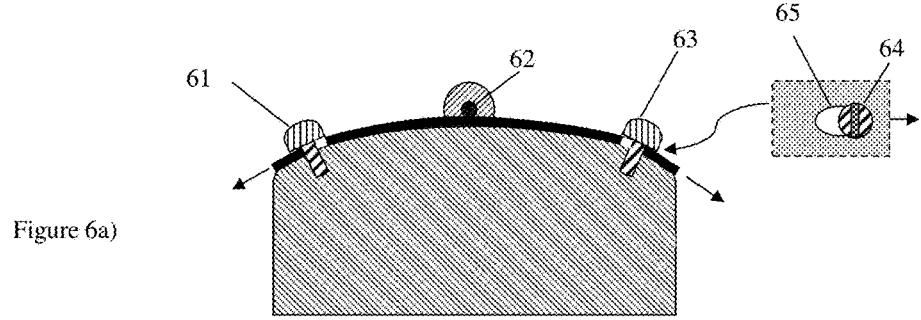
Figure 6a)
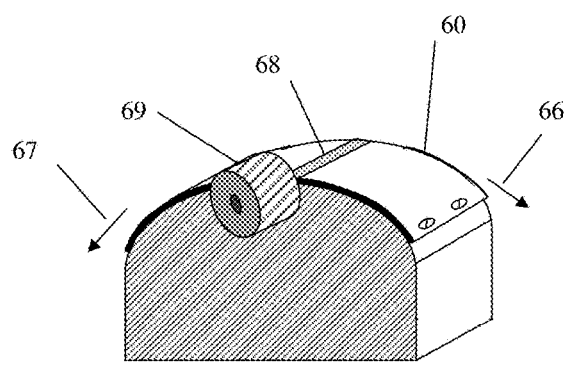
Figure 6b)
FIG.6

FIG. 8: Partly prior art

TRANSISTOR TEST FIXTURE WITH CONVEX SURFACE OF THE SUPPORT BLOCKS

PRIORITY CLAIM

This application claims priority on provisional application 62/130,894, titled "Transistor Test Fixture with Convex Surface", filed on Mar. 10, 2015.

CROSS-REFERENCE TO RELATED ARTICLES

1. TSIRONIS Christos, U.S. Pat. No. 6,414,563, "Low-Loss Microwave Device Test Fixture with Adjustable Blocks"
2. "Test Fixture for Medium and High Power RF Transistors", Product Note 7, Focus Microwaves, January 1994
3. "AV-F Series Load-pull Transistor Test Fixture with impedance transformation", Anteverta Microwave, brochure 2012
4. Coplanar Waveguide, https://en.wikipedia.org/wiki/Coplanar_waveguide
5. "MLTF, Minimum Loss Test Fixture", Product Note 70, Focus Microwaves, August 2001
6. "RT/Duroid® 5870/5880 High Frequency Laminates", Rogers Corporation, Datasheet

BACKGROUND OF THE INVENTION

This invention relates to test fixtures used in testing RF transistors in microwave frequencies (see ref. 1, 2 and 3). Active RF components (transistors—DUT) need to be thoroughly tested at the operation frequencies before used in amplifier and other circuit designs. Regular transistor test fixtures come in two basic forms: Micro-strip fixtures (FIGS. 1 and 3) or coaxial fixtures (see ref. 1 and 5).

Transistor test fixtures usually comprise an input (2) and an output (4) block, on which' external ports in form of coaxial connectors (1, 5) are attached. The blocks can be cascaded (3) directly in order for their internal ports (9, 10) to meet and the fixture to be calibrated (when the INSERT (8) is not used) and the measured data corrected back (de-embedded) to the transistor (7, DUT) reference plane (FIG. 2), or they can be separated, in order to insert a block (8, INSERT) which carries the DUT (7) (FIG. 1). The signal is guided through micro-strip lines (6) or coplanar waveguide lines (see ref. 4) leading to the transistor (21) input (22) and output (24) terminals. The transistor package (21, 7) is normally grounded (23) on the INSERT (8) using clamps or screws.

The problem with this structure is shown in FIG. 4b). The soft dielectric substrate (43) normally subsides to the pressure of the screws (44) holding it in place (also shown in FIG. 3 (39)) and bend, allowing cavities (41) to be formed between the conductively coated (metallized) substrate bottom and the top of the metal block (45). These cavities often create undesired random resonances (see FIG. 8, item (81)), which make the fixture useless.

BRIEF SUMMARY OF THE INVENTION

This invention discloses a radio frequency (RF) transistor test fixture, which uses metallic input and output modules (boxes) and transistor inserts with axially convex surface ensuring perfect (continuous and cavity-free) ground contact of the ground plane of the plastic substrate carrying the micro-strip transition line with the top of the insert, without having to solder the substrate on the fixture blocks and insert. The axis of the convex surface is in line with the micro-strip or coplanar waveguide (CPW) transmission line manufactured on the dielectric substrate.

BRIEF DESCRIPTION OF THE DRAWINGS

The invention and its mode of operation will be better understood from the following detailed description when read with the appended drawings in which:

FIG. 1 depicts prior art, a view of a typical micro-strip transistor test fixture.

FIG. 2 depicts prior art, a typical packaged microwave power transistor.

FIGS. 3a) through 3b) depict prior art: FIG. 3a) depicts top view and FIG. 3b) depicts cross section of a micro-strip transistor test fixture using soft (flexible) dielectric substrate and 50 Ohm micro-strip transmission line mounted on top of the fixture blocks and fastened using a number of screws.

FIGS. 4a) through 4b) depict prior art: FIG. 4a) depicts a side view and FIG. 4b) depicts a front view (along the transmission line); both views point to potential problems arising from the soft dielectric substrate (see ref. 6) lifting and creating a cavity when secured using screws or the connector pin on flat test fixture blocks.

FIGS. 5a) through 5b) depict a front views of test fixture block; FIG. 5a) depicts the bare metallic block and coaxial connector; FIG. 5b) depicts a front view of the block with the dielectric substrate mounded and secured with screws and the connector center pin.

FIGS. 6a) through 6b) depict views of the test fixture mounting details: FIG. 6a) is a cross section of test fixture block with dielectric substrate stretched over the convex surface using screws mounted in oval holes in the substrate for adjustment and FIG. 6b) depicts a 3D view of the assembled block.

DETAILED DESCRIPTION OF THE INVENTION

Figure 7:
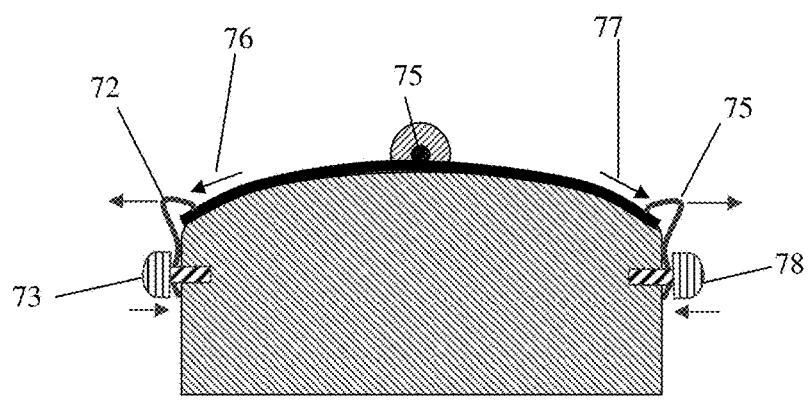
FIG. 7 depicts cross section view of test fixture block with dielectric substrate stretched over the convex surface using clamps.

A typical micro-strip transistor test fixture (TTF, FIG. 3) comprises two coaxial signal ports, an input port (30) and an output port (37). A thin (typically approximately 1 mm thick) dielectric substrate (36), see ref. 6, is applied and mechanically held tightly on a metallic block (310), which serves as electrical ground and heat sink for the thermal energy dissipated by the transistor package (33). Two such blocks are used, one for the input and one for the output section of the fixture. The signal travels on the micro-strip conductor (31) between the input port (30) to the input terminal of the transistor (34) and from the output terminal of the transistor to the output connector (37). The micro-strip line (31) is fabricated (etched) out of the previously metallized (conductively coated) surface of the dielectric substrate, whereas its opposite surface remains fully metallized (conductively coated). The transistor package (FIG. 2) contains the transistor semiconductor chip inside a ceramic housing (21) and the ground terminal (typically the transistor source) is connected to a metallic support (23) which is mounted tightly with screws (300) on the test fixture insert (35, 311). The insert (311) can be replaced with another one of different size or with built-in impedance transformers for different transistors and packages.

Figure 8:
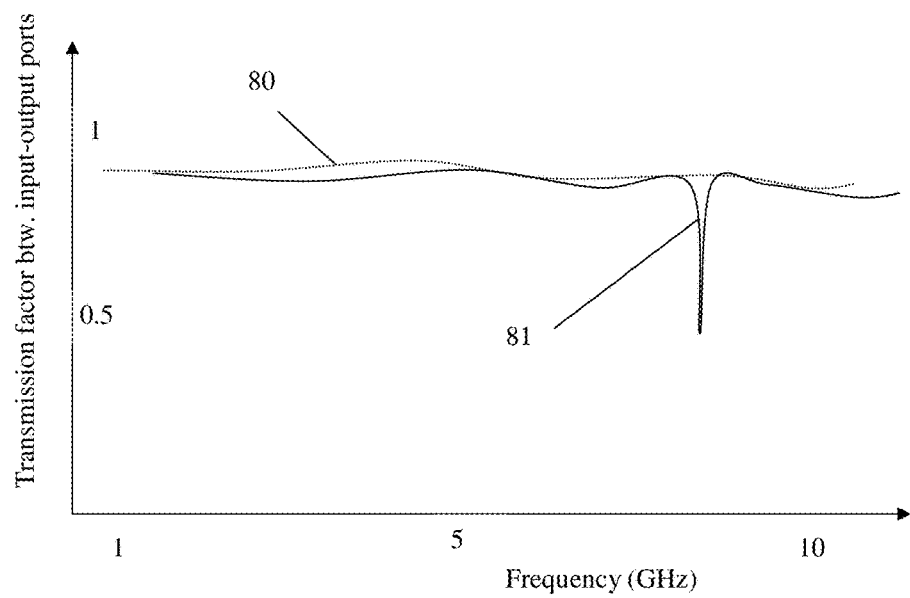
FIG. 8 depicts partly prior art, comparison of wideband frequency response of fixture transmission factor between a fixture with flat surface blocks having cavities (81) and a fixture with convex surface blocks without cavities (80).

The main issue for the structure of FIG. 3, which is broadly used, because it is practical, economic and easy to manufacture and manipulate, is holding the substrate (36) flat on the top metal surface of the blocks (310) and (312), in a way that there are no gaps between the two metallic surfaces, the top of the blocks and the metallization of the substrate bottom. This is attempted using a battery of screws (39) placed on the sides of the substrate; it is obvious that the screws cannot be placed very close to the micro-strip line (31) in order not to disturb the transmitted signal. Everybody familiar with simple mechanics, even a layman, understands that, when pressing a soft material against a rigid one using screws, the soft material may "lift off" or "wrinkle". This is shown in FIGS. 4a) and 4b). The substrate (43) is pressed against the metal (45) using screws (44) or the center pin (42) of the coaxial RF connector on the input (or output) port side and the DUT (47) lead terminal (48) on the side of the INSERT (46). This phenomenon may cause the soft substrate to "buckle" and create hairline kind of cavities (41) between the metallized bottom surface of the substrate (43) and the top surface of the metallic block (40, 45). If this happens then uncontrollable resonances (81) appear as shown in FIG. 8, (see also ref. 3, FIG. 1 on page 2). The fixture becomes useless.

The method that has been used to date in order to securely avoid this spurious phenomenon from happening is soldering the metallized (conductively coated) bottom of the substrate on the metallic blocks. Metallization is the usual method of conductively coating flexible dielectric substrates. This, however, requires (i) that the blocks are made of "solder able" material, i.e. brass or copper but not (cheaper) aluminum, (ii) special heating of the blocks during soldering and cooling, (iii) manipulating large amounts of solder and, last not least, when soldered, (iv) exchanging substrates when needed, becoming a major unsoldering, cleaning and re-soldering operation, assuming soldering is possible. Alternative techniques used, beyond soldering, employ inserting batteries of screws (44), placed at various intervals and distances (see also FIG. 1 in ref. 3), in the hope that cavities will not appear. But there is never a warranty for that, and operators always try to make sure there are no spurious resonances, caused by such cavities, by pressing on the substrates with some low dielectric batons (like cotton tipped sticks, Teflon rods etc.). It is generally admitted that, beyond soldering, there is, to date, no reliable solution to the problem. The biggest issue with this phenomenon is that it is "random" and may appear at any time of the operation, even after a perfect calibration, simply when the fixture is manipulated, without any way of detecting it in operation, beyond obtaining strange measurement data.

The apparatus and method proposed in this invention solves this problem securely (FIGS. 5 to 7) and simply. It uses metallic blocks (51) with a convex surface (55). When the flexible dielectric substrate (53) is applied on the block surface (55) and stretched sideways using screws (52) then the probability of "lift-off" (41) because of "wrinkles" (43) and cavities (41) disappears, as everybody understands.

Of course some limitations apply: The correct method is shown in FIG. 6: the screws (61), (63) must be placed in such a way as to pull the substrate sideways (66), (67) perpendicularly to the transmission line, and stretch it over the convex surface (60) of the block; and not push the substrate towards the center of the block surface, against the directions (66) and (67), in which case the substrate would "lift-off" and create a cavity.

In a different embodiment the effect of screws can be obtained using special clamps (72), (75) as shown in FIG. 7. In this case the clamps are designed in a way that, when the screws (73) and (78) push the clamps against the metal block, the edge of the clamps digs into the soft substrate and pulls it sideways (76), (77) in order to establish a perfect contact between the bottom of the substrate and the convex surface of the block. Alternatively clamps can be used, which would grab and pull the substrate sidewise when pulled off the metal block. This method has the advantage that no holes need to be drilled into the dielectric substrate and no screws are present on the top of the block, thus leaving a maximum of space available to be used by other circuitry, if necessary.

A further limitation concerns the curvature (or the radius) of the convex surface. In reality only a slight convexity is needed. For certain it shall not exceed the elasticity limit of the dielectric substrate. This means that, even after applying the pressure on the substrate with the screws or the clamps, the substrate shall not suffer a permanent deformation; after releasing it, it should return into its original flat form.

Figure 9:
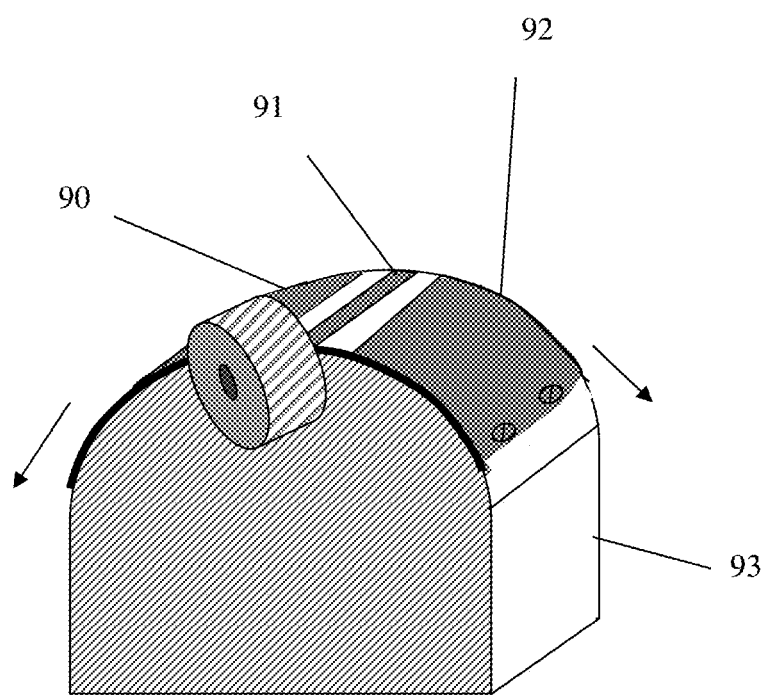
FIG. 9 depicts a 3D view of a fixture block with convex surface and mounted coplanar waveguide manufactured on soft dielectric substrate.

In the case where a Coplanar Waveguide (CPW) structure used as transmission line (see ref. 4) the spurious cavities may also be created between the metallized bottom of the substrate and the top of the flat blocks. Again, there will be the same type of discontinuity and spurious resonances, which will affect the transmission behavior (see FIG. 8), since the structures are not designed to be used with air gaps between the bottom of the dielectric substrate and the metal blocks. In this case the method of convex surface (FIG. 9) must also be used to eliminate the cavities between the CPW substrate (90, 91, 92) and the surface of the blocks.

In both cases, micro-strip (FIG. 6) and coplanar waveguide (FIG. 9) the bottom surface of the flexible dielectric substrate may be left un-metallized, depending on the continuity of the ground plane on the surface of the blocks. This method is possible, though mostly avoided, in order to be able to guarantee the accurate dimensions (thickness) of the dielectric material and predict accurately the transmission line behavior.

Figure 10:
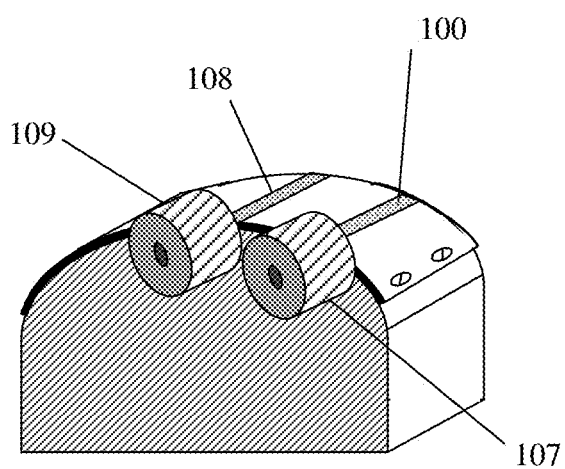
FIG. 10 depicts a test fixture with convex surface and multiple transmission lines.

In an alternative embodiment, in case the DUT has multiple input and/or output terminals (such as push-pull or differential devices) the test fixture blocks (FIG. 10) can have multiple transmission lines (108), (100), which may originate from a single connector (109) or multiple connectors (107), (109). In all cases the concept of convex block surface applies equally.

Although the present invention has been explained hereinabove by way of a number of preferred embodiments, it should be pointed out that other combinations of the described components are possible and, as far as obvious to a person skilled in the art, they shall not limit the scope of the present invention.

What I claim as my invention is:

1. A radio frequency (RF) test fixture for RF transistors (device under test, DUT), comprising a) an input and an output metallic support block, said blocks having convex top surface, b) a DUT-carrying block (INSERT), said DUT having input and output terminals;

whereby
each support block has an input side and an output side;

and whereby
sheets of flexible, surface-metallized soft dielectric (plastic) substrate, having a top surface and a bottom surface, are deposited and secured on the convex top surface of the support blocks, said sheet having one or more microstrip transmission lines fabricated (etched) on their top surface;

and whereby
the INSERT is inserted and secured between the input and output support blocks;

and whereby
the input support block has one or more input RF connectors on its input side and is attached to the INSERT on its output side;

and whereby
the output support block has one or more output RF connectors on its output side and is attached to the INSERT on its input side;

and whereby
the axis of the convex top surface of the support blocks is parallel to the axis between the INSERT and the RF connectors;

and whereby
the transmission lines lead from the RF connectors to the DUT terminals.

2. The DUT as in claim 1 being a packaged RF transistor.

3. The fixture as in claim 2,
whereby the microstrip transmission line(s) on the input support block lead from the RF connector(s) to the DUT input terminal(s) and the microstrip transmission line(s) on the output support block lead from the DUT output terminal(s) to the RF connector(s).

4. The fixture as in claim 1,
whereby the dielectric substrates are conductively coated (metallized) on the bottom surface, which faces the convex top surface of the input and output support blocks,
and have one or more micro-strip line(s) fabricated (etched) on their conductively coated (metallized) top surface.

5. The fixture as in claim 1,
whereby the dielectric substrates have one or more coplanar waveguide (CPW) transmission line(s) fabricated on their conductively coated (metallized) top surface.

6. The fixture as in claim 5,
whereby the dielectric substrates are stretched perpendicularly to the axis of the transmission lines on each block, to establish continuous, secure and cavity-free ground contact between the metallized bottom of the dielectric substrates and the convex top of the support blocks.

7. The fixture as in claim 6,
whereby the curvature of the convex top surface of the support blocks is small enough to allow for the dielectric substrates, after said substrates have been deposited and secured, to remain within their elasticity range.

* * * * *